(12) United States Patent
Lechner (10) Patent No.: US 9,570,269 B2
(45) Date of Patent: Feb. 14, 2017

(54) METHOD FOR MANUFACTURING A TEM-LAMELLA AND ASSEMBLY HAVING A TEM-LAMELLA PROTECTIVE STRUCTURE

(71) Applicant: Carl Zeiss Microscopy GmbH, Jena (DE)

(72) Inventor: Lorenz Lechner, Dublin, CA (US)

(73) Assignee: Carl Zeiss Microscopy GmbH, Jena (DE)

( * ) Notice: Subject to any disclaimer, the term of this patent is extended or adjusted under 35 U.S.C. 154(b) by 393 days.

(21) Appl. No.: 14/337,470

(22) Filed: Jul. 22, 2014

(65) Prior Publication Data

US 2015/0028225 A1    Jan. 29, 2015

(30) Foreign Application Priority Data

Jul. 23, 2013   (DE) .................. 10 2013 012 225

(51) Int. Cl.
| | | |
|---|---|---|
| *H01J 37/20* | (2006.01) | |
| *B32B 38/00* | (2006.01) | |
| *B32B 38/10* | (2006.01) | |

(52) U.S. Cl.
CPC .......... *H01J 37/20* (2013.01); *B32B 38/0004* (2013.01); *B32B 38/10* (2013.01); *H01J 2237/026* (2013.01); *H01J 2237/31745* (2013.01); *Y10T 156/1052* (2015.01)

(58) Field of Classification Search
CPC ............. H01J 2237/31744; H01J 2237/31745; H01J 37/20; B32B 38/0004; B32B 38/00
See application file for complete search history.

(56) References Cited

U.S. PATENT DOCUMENTS

| | | | |
|---|---|---|---|
| 5,907,157 | A | 5/1999 | Yoshioka et al. |
| 5,940,678 | A | 8/1999 | Doong et al. |
| 6,784,427 | B1 | 8/2004 | Grunewald et al. |
| 2002/0000522 | A1 | 1/2002 | Alani |
| 2003/0180627 | A1 | 9/2003 | Lavallee et al. |
| 2004/0016880 | A1 | 1/2004 | Reiner et al. |
| 2004/0129878 | A1 | 7/2004 | Tomimatsu et al. |
| 2004/0261719 | A1 | 12/2004 | Arjavac et al. |
| 2006/0000973 | A1 | 1/2006 | Gezinus Tappel |
| 2006/0261270 | A1 | 11/2006 | Burkhardt et al. |

(Continued)

FOREIGN PATENT DOCUMENTS

| | | |
|---|---|---|
| DE | 60 2005 000 352 T2 | 5/2007 |
| DE | 601 30 889 T2 | 9/2008 |

(Continued)

OTHER PUBLICATIONS

German Office Action, with translation thereof, for DE Appl No. 10 2013 012 225.2, dated May 14, 2014.

*Primary Examiner* — Wyatt Stoffa
*Assistant Examiner* — Sean Luck
(74) *Attorney, Agent, or Firm* — Fish & Richardson P.C.

(57) ABSTRACT

A method for manufacturing a TEM-lamella is disclosed. The method includes: disposing a self-supporting protective structure on a surface of a substrate; bonding the protective structure to the substrate; cutting out a lamella from the substrate using a particle beam so that the lamella remains bonded to at least a portion of the protective structure; fastening a first tool to the lamella; and moving away the lamella from a residual portion of the substrate by moving the first tool relative to the substrate.

26 Claims, 5 Drawing Sheets

(56) References Cited

U.S. PATENT DOCUMENTS

| | | |
|---|---|---|
| 2008/0038928 A1 | 2/2008 | Rueger et al. |
| 2008/0054179 A1 | 3/2008 | Luo et al. |
| 2008/0102224 A1 | 5/2008 | Blackwood et al. |
| 2008/0276319 A1 | 11/2008 | Rittermann |
| 2009/0126051 A1 | 5/2009 | Kagaya |
| 2010/0025577 A1* | 2/2010 | Grunewald .............. G01N 1/32 250/307 |
| 2010/0032581 A1 | 2/2010 | Grosse et al. |
| 2010/0276607 A1 | 11/2010 | Wanzenboeck et al. |
| 2010/0300873 A1 | 12/2010 | Blackwood et al. |
| 2010/0305747 A1 | 12/2010 | Agorio et al. |
| 2012/0126146 A1 | 5/2012 | Kaneko et al. |

FOREIGN PATENT DOCUMENTS

| | | |
|---|---|---|
| DE | 11 2010 003 115 T5 | 12/2012 |
| EP | 2 060 898 A2 | 5/2009 |
| EP | 2 024 141 B1 | 10/2009 |
| EP | 2 275 797 A1 | 1/2011 |
| JP | 2007-108042 A | 4/2007 |
| WO | WO 2008/051880 A2 | 5/2008 |
| WO | WO 2008/051937 A2 | 5/2008 |

\* cited by examiner

METHOD FOR MANUFACTURING A TEM-LAMELLA AND ASSEMBLY HAVING A TEM-LAMELLA PROTECTIVE STRUCTURE

CROSS-REFERENCES TO RELATED APPLICATION

This application claims priority under 35 U.S.C. §119 to German patent application serial number 10 2013 012 225.2, filed Jul. 23, 2013, the entire contents of which are incorporated by reference herein.

FIELD

The disclosure relates to a method for manufacturing a TEM-lamella and assembly having a TEM-lamella protective structure.

BACKGROUND

The analysis of objects using transmission electron microscopes (TEM) is an important method of analysis in the field of material science and in particular for the manufacturing of miniaturized objects, such as semiconductor devices. In order to analyze an object using a transmission electron microscope, a sample appropriate for being transmitted by an electron beam is prepared from the object. Such samples typically have a sheet-like shape with a thickness of less than, for example, 2 micrometer and are referred to as TEM-lamellae.

If a region of interest of an object is to be analyzed using the transmission electron microscope, a typical task is to prepare out a TEM-lamella from a substrate material of the object so that the region of interest is at least partially contained within the TEM-lamella. For this, material is conventionally removed by ion beam processing on both sides of a stripe disposed on the surface of the substrate above the region of interest and having a width of, for example, 5 micrometer, so that substrate material remains underneath the stripe, wherein the substrate material forms the TEM-lamella later on. Then, a tool is fastened to the stripe and more substrate material is removed until a material plate is fully cut free from the residual substrate. The material plate can be moved away from the substrate by using the tool. The material plate fastened to the tool may then further be thinned to finally form the TEM-lamella.

For preparing out a TEM-lamella from a substrate material, a particle beam system is often used including an ion beam column and an electron microscope (SEM) detecting secondary electrons, wherein the ion beam generated by the ion beam column for processing the substrate and the electron beam generated by the electron microscope for generating electron microscopic images of the substrate may be directed onto a common working area so that progress of the processing using the ion beam may be monitored by using the electron microscope.

For removing the substrate material on both sides of the stripe, an ion beam is directed onto those regions of the substrate from which material is to be removed. As the ion beam used thereto does not provide a sharply defined beam cross-section having, for example, a Gaussian intensity profile, ions also hit the stripe and penetrate into the region of the substrate forming the lamella later on and containing the region of interest. This region of the substrate is modified by the impinging ions so that the structure of the material in the region of interest is adulterated and might not be determined correctly by the subsequent analysis using the transmission electron microscope.

Therefore, a sufficiently thick protective layer of, for example, a metal is conventionally deposited on the stripe prior to the removing of material using the ion beam on both sides of the stripe, wherein the protective layer prevents the ions from penetrating into the substrate during the removing of the substrate material on both sides of the stripe.

Such protective layers are conventionally deposited from the gaseous phase, wherein the depositing is induced by irradiating the stripe using at least one of electron beams and ion beams.

The depositing of such protective stripes is elaborate and, in particular, the depositing from the gaseous phase involves specific technical equipment and influences subsequent processing steps to be executed in a high vacuum.

SUMMARY

Therefore, it is an objective of the present disclosure to propose a method for manufacturing a TEM-lamella which does not require the depositing of a protective layer and, in particular, which does not require the depositing of material from the gaseous phase.

Embodiments of the disclosure include a method for manufacturing a TEM-lamella, the method including disposing of a self-supporting protective structure on a surface of a substrate and bonding the protective structure to the substrate.

According to exemplary embodiments, the self-supporting protective structure includes an elongated rod-shaped component having a long side being disposed onto the substrate during the disposing of the self-supporting protective structure on the surface of the substrate. The long side of the rod-shaped component may, for example, have a length greater than 20 µm and/or a width of less than 5 µm.

According to exemplary embodiments, the self-supporting protective structure includes at least one handle disposed at the elongated rod-shaped component, in particular at an end of the elongated rod-shaped component. In particular, the at least one handle extends from the elongated rod-shaped component. The at least one handle may be used, for example, for manipulating, positioning and connecting the protective structure and, in particular, the elongated rod-shaped component with respect to tools, mounts and the like.

According to further exemplary embodiments, the entire protective structure or, if present, at least the rod-shaped component and/or at least one handle consist of a material selected from a group of materials including at least silicon, diamond, oxides and nitrites.

According to exemplary embodiments, the method further includes, subsequent to the bonding of the protective structure to the substrate, cutting out a lamella from the substrate using a particle beam so that the lamella remains bonded to at least a portion of the protective structure. For this, the particle beam is directed onto the substrate next to the protective structure bonded to the substrate in order to remove substrate material at this location. The material of the substrate is not removed from underneath the protective structure and will form the TEM-lamella later on. The protective structure prevents the particles of the particle beam from penetrating into the region of the substrate forming the TEM-lamella later on during this processing so that the structure of the substrate within the TEM-lamella remains substantially unchanged and may be determined correctly in the subsequent analysis using the transmission electron microscope.

According to further embodiments, the method further includes fastening a first tool to the lamella and moving away the lamella from a residual portion of the substrate by moving the first tool relative to the substrate.

According to exemplary embodiments, the first tool is fastened to the lamella as soon as a large portion of the material to be removed from the substrate for cutting out the lamella is already removed, however, some portion of this material still remains between the residual substrate and the future lamella. After the fastening of the first tool to the lamella, the residual material may then be removed using the particle beam so that the lamella is fully cut free from the substrate.

According to exemplary embodiments, the bonding of the protective structure to the substrate includes forming molecular bonds between the protective structure and the substrate. By this, the protective structure and the substrate are connected to each other by atomic or molecular forces. Molecular bonds are formed by, for example, soldering, welding, adhering and vulcanizing.

According to exemplary embodiments, the forming of the molecular bonds between the protective structure and the substrate includes directing a particle beam onto at least one of the protective structure and the substrate so that material being removed by the particle beam from the protective structure and the substrate, respectively, is redeposited at a region between the protective structure and, hence, bonds the substrate and the protective structure to each other.

According to exemplary embodiments, the forming of the molecular bonds between the protective structure and the substrate is fully established by material being dislodged, by the directing of the particle beam, from the protective structure and/or the substrate and, in particular, without supplying other material than the dislodged materiel, e.g., material supplied by particle beam induced deposition.

According to alternative exemplary embodiments, the forming of the molecular bonds includes applying an adhesive agent to at least one of the substrate and the protective structure; and curing the adhesive agent by directing at least one of a particle beam and a light beam onto at least one of the adhesive agent and the substrate in proximity of the adhesive agent and the protective structure in proximity of the adhesive agent. Further, it is possible to form the molecular bonds between the protective structure and the substrate by thermal activity, for example, by heating the protective structure or a tool connected to the protective structure.

Some embodiments include the protective structure to be provided by/on a mount prior to the disposing of the protective structure on the surface of the substrate, grasped by a second tool, detached from the mount by moving the second tool relative to the mount, and to be disposed on the surface of the substrate using the second tool.

According to exemplary embodiments, the at least one handle of the protective structure may be used for grasping the protective structure by the second tool.

According to exemplary embodiments, the protective structure and the mount are integrally formed wherein a predetermined breaking point is provided between the protective structure and the mount, and wherein the detaching of the protective structure from the mount includes breaking the predetermined breaking point by moving the second tool relative to the mount. The predetermined breaking point may be formed in a way that a cross-section of the material integrally forming the protective structure and the mount is smaller than a cross-section of the material at regions of the mount and the TEM-lamella, the regions being adjoined to the predetermined breaking point.

According to further embodiments, the fastening of the first tool to the lamella includes bringing into contact the first tool and the protective structure.

According to further exemplary embodiments, the fastening of the first tool to the lamella includes forming a frictional connection between the first tool and the protective structure, in particular between the first tool and the at least one handle of the protective structure.

According to further exemplary embodiments, the frictional connection between the first tool and the protective structure may, for example, be formed by clamping the protective structure, in particular the at least one handle of the protective structure, to the first tool.

For this, the first tool may be configured as a gripper or tweezers having two components allowing the protective structure, in particular the at least one handle of the protective structure, to be disposed in between. Forces directed towards each other acting on both the components incur a frictional connection between the two components and the protective structure so that the frictional connection fastens the protective structure together with the lamella to the first tool.

According to further exemplary embodiments, the fastening of the first tool to the lamella includes forming molecular bonds between the first tool and the portion of the protective structure, wherein the forming of the molecular bonds, in turn, may include directing a particle beam onto at least one of the portion of the protective structure and the first tool.

According to exemplary embodiments, the forming of the molecular bonds between the first tool and the portion of the protective structure is fully established by material being dislodged, by the directing of the particle beam, from the protective structure and/or the substrate and, in particular, without supplying other material than the dislodged materiel, e.g., material supplied by particle beam induced deposition.

According to further embodiments, the lamella is thinned by ion beam processing after the moving away of the lamella from the residual portion of the substrate so that a thickness of the lamella in the region to be analyzed is sufficiently small to allow for transmitting an electron beam of a transmission electron microscope and a respective analysis using the transmission electron microscope. For this, the thickness of the lamella may be, for example, less than 1 µm or less than 200 nm or, in particular, less than 100 nm.

According to further embodiments, the lamella is mounted to a sample mount after the moving away from the residual portion of the substrate and, if appropriate, after further thinning.

According to exemplary embodiments, the mounting of the lamella to the sample mount includes bringing into contact the protective structure and the sample mount. The mounting of the lamella to the sample mount may further include forming a frictional connection between the sample mount and the portion of the protective structure and, in particular, clamping the protective structure to the sample mount.

According to exemplary embodiments, the forming of the frictional connection between the sample mount and the portion of the protective structure may include forming a frictional connection between the sample mount and the at least one handle, i.e. the at least one handle of the protective structure is used for the forming of the frictional connection between the sample mount and the portion of the protective structure. This sample mount may subsequently be disposed in a transmission electron microscope in order to analyze the lamella, which is mounted to the sample mount, using the transmission electron microscope.

According to further embodiments of the disclosure, an assembly having a TEM-lamella protective structure is proposed, the assembly including a mount and at least one TEM-lamella protective structure provided by/on the mount, wherein the mount and the at least one TEM-lamella protective structure are integrally formed from a material, wherein a predetermined breaking point is provided between the mount and the at least one TEM-lamella protective structure, and wherein a cross-section of the material at the predetermined breaking point is smaller than a cross-section of the material at regions of the mount and the at least one TEM-lamella protective structure, the regions being adjoined to the predetermined breaking point.

According to exemplary embodiments, multiple TEM-lamella protective structures are provided by the mount.

For example, this assembly may be disposed in a working area of the second tool together with the substrate so that, when desired, a protective structure may be detached from the mount and disposed on the surface of the substrate by the second tool.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

Subsequently described embodiments relate to methods for manufacturing a TEM-lamella and its analysis using a transmission electron microscope (TEM). Such conventional methods are known from WO 2008/051937 A2, WO 2008/051880 A2, US 2008/0054179 A1, US 2004/0016880 A1 and EP 2 275 797 A1, the disclosure of which is incorporated by reference herein.

Some of these conventional methods include depositing a protective stripe on a substrate by a material depositing process prior to cutting out a lamella from the substrate by ion beam processing in order to prevent ions from entering the substrate in the region of the lamella and modifying the structure of the substrate. The depositing of such a protective stripe on the substrate involves special equipment for providing a precursor of the material to be deposited, such as a metal-organic compound, to the substrate. Such equipment is not required for the embodiments subsequently described as a protective structure providing the function of the conventional protective stripe is disposed at the substrate in a way that the material depositing process is not required anymore.

Figure 1:
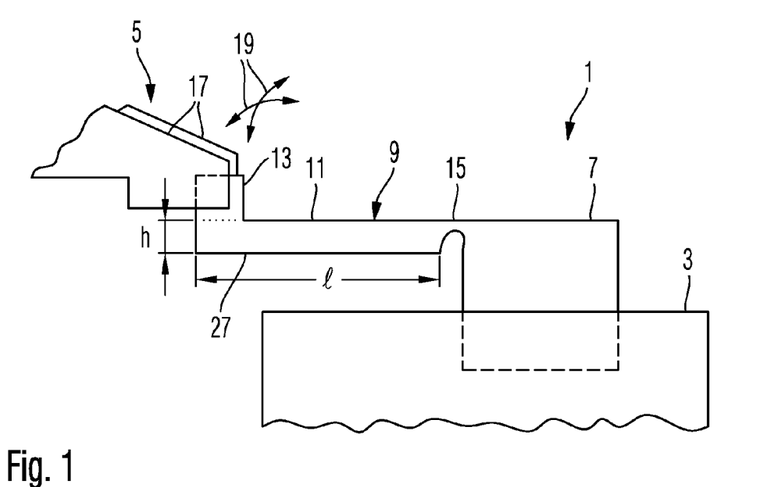
FIGS. 1 to 5 are schematic illustrations for elucidating a method for manufacturing a TEM-lamella according to an embodiment of the disclosure.

FIG. 1 shows an assembly having a TEM-lamella protective structure provided on a base 3 by, for example, the TEM-lamella protective structure being clamped into a slit. The base 3 having the assembly 1 provided thereon is disposed in a working area of a tool 5 within a vacuum chamber of an ion beam device. The assembly 1 includes a mount 7 by which the assembly 1 is provided on the base 3; and the protective structure 9. The protective structure 9 has an elongated rod-shaped component 11 from which a handle 13 projects out. The rod-shaped component 11 has, for example, a length l of 10 µm or more, in particular, of 20 µm or more, a height h of 10 µm and a width b (see FIG. 3) of 5 µm or less. The protective structure 9 and the mount 7 are formed integrally of a material. The material may be amorph or polycrystalline and may include at least one of, for example, silicone, diamond, an oxide and a nitrite.

A predetermined breaking point 15 is provided between the protective structure 9 and the mount 7. The predetermined breaking point 15 is formed by a material taper so that a cross-section in the region of the predetermined breaking point is less than a cross-section of the regions of the protective structure 9 and the mount 7, the latter regions being adjoined to the predetermined breaking point 15.

The assembly 1 integrally formed by the protective structure 9 and the mount 7 may be formed, for example, from a flat material by laser milling or ion beam milling or a lithographic method.

In the subsequent processing steps, the protective structure 9 is used without the mount 7 so that the protective structure 9 is detached from the mount 7. This may be done by fastening the protective structure 9 at its handle 13 to the tool 5. The tool 5 is a micromanipulator, merely the tip of which is illustrated in FIG. 1. In the illustrated exemplary embodiment, the tip of the tool 5 is formed by a gripper having two components 17 similar to tweezers. The two components 17 may be moved towards each other by appropriate actuating of the tool 5 in order to clamp the handle 13 of the protective structure 9. The tip of the tool 5 may be displaced in multiple spatial directions and rotated about multiple axes by appropriate actuating of the tool 5. A tool appropriate for this is referred to as MGS2-EM Microgripper and commercially available from Kleindiek Nanotechnik GmbH, Reutlingen, Germany.

FIG. 1 shows a situation in which the handle 13 is clamped between both the components 17 of the tip of the tool 5. Then, it is possible to apply a force to the protective structure 9 by displacing the tool 5 relative to the mount 7 so that the predetermined breaking point 15 breaks. Hence, the protective structure 9 is detached from the mount 7. Arrows 19 indicate suchlike movements of the tip of the tool 5 relative to the mount 7.

Figure 2:
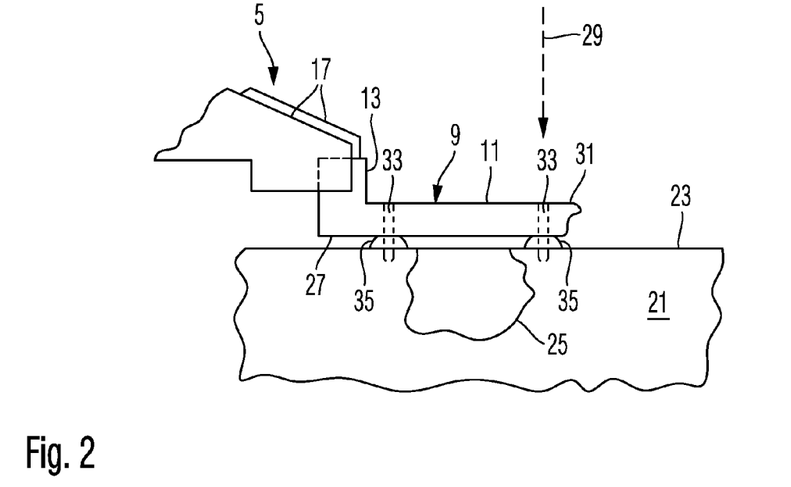

FIG. 2 shows a sectional view of a substrate 21 having a planar surface 23. The substrate 21 contains a region of interest 25 to be analyzed using a transmission electron microscope. For this, a TEM-lamella is prepared from the substrate 21, the TEM-lamella including a portion of the region of interest 25. Such a TEM-lamella is a thin sample cut out from the substrate 21, the cut being performed orthogonally to the surface 23 of the substrate 21 and, hence, parallelly to the plane of projection of FIG. 2. The sample at least partially contains the region of interest 25. For this, the substrate 21 is disposed in the working area of an ion beam device. The tool 5 is further configured in a way that its working area includes or at least is close to the working area of the ion beam device.

After the detaching of the protective structure 9 from the mount 7, the tip of the tool 5 is positioned and orientated to the surface 23 of the substrate 21 so that a flat side 27 of the rod-shaped component 11 is disposed above the region of interest 25 on the surface 23 of the substrate 21. Hence, the protective structure 9 is positioned so that the protective structure covers the region of the surface 23 of the substrate 21 which will form a surface region of the TEM-lamella later on. For this, the flat side 27 of the rod-shaped component 11 may be brought into contact with the surface 23 of the substrate 21.

Subsequently, the protective structure 9 is bonded to the substrate 21. For this, an ion beam 29 generated by the ion beam device is directed onto a flat side 31 of the rod-shaped component 11, the flat side 31 being opposite to the flat side 27. The kinetic energy of the ions of the ion beam 29 is set so that the ions remove material from the protective structure and, hence, therein form a hole 33 extending through the rod-shaped component 11 and into the substrate 23. The hole 33 should be situated relative to the region of interest 25 in a way that the hole is located laterally displaced relative to the region of interest and not above the region of interest. By the effect of the ion beam, particles are dislodged from the rod-shaped component 11 and the substrate 21 wherein these particles partially redeposit inside the hole 33 and a gap eventually existing between the flat side 27 of the rod-shaped component 11 and the surface 23 of the substrate 21. A section having such redeposited and relodged, respectively, material between the rod-shaped component 11 and the substrate 21 is labelled by numerical 35 in FIG. 2. By this ion beam processing, the protective structure 9 and the substrate 21 are "welded" with each other as the relodged material 35 leads to molecular bonds between the protective structure 9 and the substrate 21.

One or several more such bonds may be provided between the protective structure 9 and the substrate 21 by directing the ion beam 29 onto other locations of the rod-shaped component forming holes 33 in the rod-shaped component 11 and the substrate 21. FIG. 2 shows another suchlike bond indicated at the rod-shaped component 11 in proximity of the handle 13. Also these further holes should all be positioned and disposed relative to the region of interest 25 so that, while bonding the rod-shaped component 11 to the substrate 21, damaging or contaminating the substrate in the region of interest 25 is avoided.

In the example previously elucidated, the forming of the molecular bonds is performed by material redeposition during the forming of the hole in the rod-shaped component 11 and the substrate 21. However, it is also possible to direct the ion beam onto the substrate 21 in proximity of the rod-shaped component 11 wherein material dislodged from the substrate 21 relodges at the rod-shaped component 11 and the surface 23 of the substrate 21 and, hence, also bonds these to each other by forming molecular bonds.

Furthermore, it is also possible to bond the rod-shaped component 11 of the protective structure 9 and the substrate 21 by an adhesive agent. For this, the adhesive agent is applied to the flat side 27 of the rod-shaped component 11 and/or the surface 23 of the substrate 21 prior to bringing into contact the rod-shaped component 11 and the surface 23 of the substrate 21. After bringing into contact the rod-shaped component 11 and the substrate 21, this adhesive agent is cured. This may be done, for example, by irradiation using the ion beam 29 or some other particle beam. An example of an appropriate adhesive agent is a product named SemGlu commercially available from the company Kleindiek Nanotechnik GmbH, Reutlingen, Germany.

After the bonding of the protective structure 9 to the substrate 21, the tool 5 may be unfastened from the protective structure 9 after both the components 17 are displaced from each other by appropriate actuating of the tool 5 in order to disable clamping between the components 17 and the handle 13.

Then, a lamella 41 is partially cut out from the substrate 21 by directing the ion beam 29 onto the substrate 21 on both sides of the rod-shaped component 11 in order to there remove material by ion beam processing.

Figure 3:
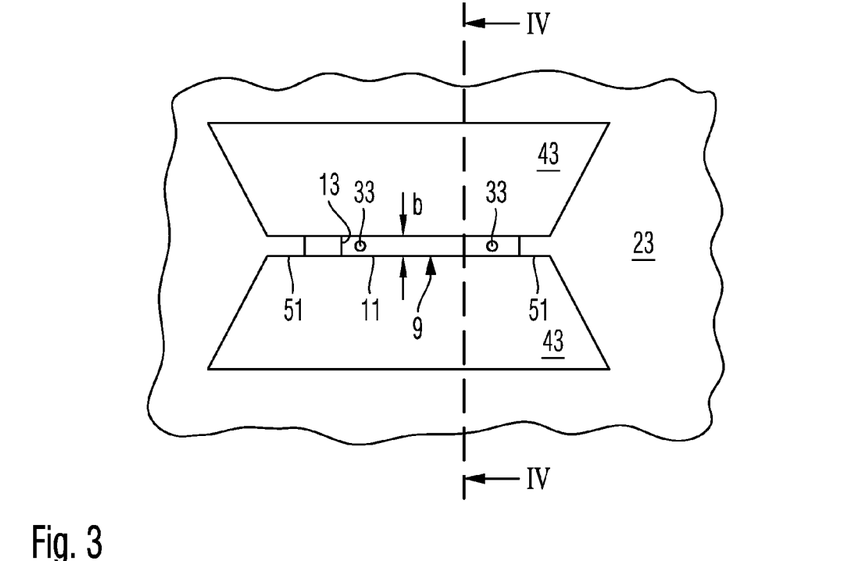

FIG. 3 shows a top view onto the substrate 21 and the protective structure 9 in a situation in which the lamella is partially cut out.

Figure 4:
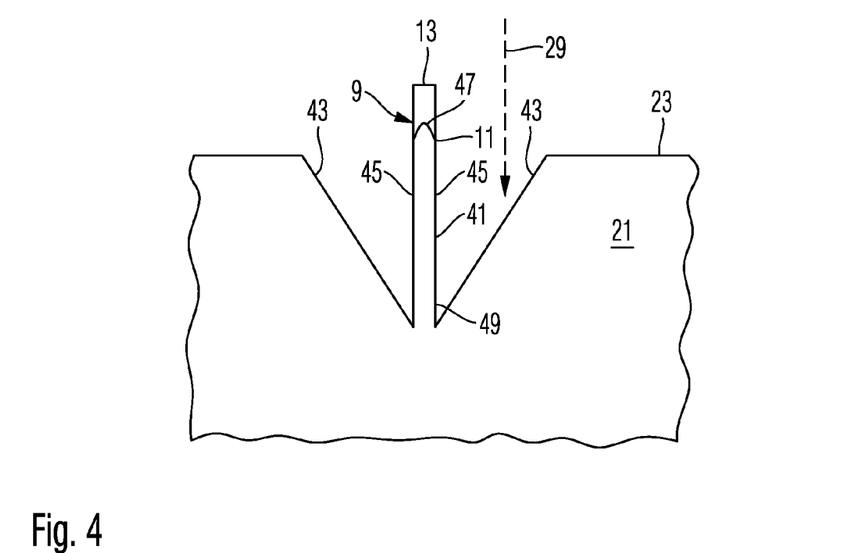

FIG. 4 shows a sectional view through the substrate 21 and the protective structure 9 along the line IV-IV of FIG. 3, in the same situation.

By processing using the ion beam 29, material of the substrate 21 is removed on both sides of the rod-shaped component 11 of the protective structure 9 so that trenches are formed on both sides of the rod-shaped component 11 in the substrate 21, each of which is defined by a surface 43 of the substrate 21 and a surface 45 of the lamella 41 remaining underneath the protective structure 9.

Here, the protective structure 9 prevents ions of the beam 29 from penetrating into the substrate material of the lamella 41 underneath the rod-shaped component 11. Ions which could penetrate into the substrate material underneath the protective structure 9 are absorbed or scattered away by the protective structure 9. This may cause material of the rod-shaped component 11 also being removed as indicated in FIG. 4 by a section of the rod-shaped component 11 labelled by numeral 47, the section being rounded due to material ablation and not having its original rectangular cross-section anymore.

In the situation illustrated in FIGS. 3 and 4, the lamella 41 is merely partially cut free as the lamella 41 remains connected to the residual substrate 21 in the lower region 49 of the lamella and at its front and back ends 51 of the lamella.

After partially cutting free the lamella 41, a tool is again fastened to the protective structure 9 so that the protective structure 9 and the lamella 41 bonded to the protective structure 9 may commonly be held by the tool. After this fastening of the protective structure 9 to the tool, the lamella 41 is fully cut free from the substrate 21 by directing the ion beam 29 onto the regions 49 and 51 of the substrate material. For this, it is possible to orientate the substrate 21 relative to the ion beam 29 in a way that the ion beam 29 does not orthogonally impinge onto the surface 23 of the substrate 21 as illustrated in the FIGS. 2 and 4. In particular for severing the material region 49, the substrate may be orientated in a way that the ion beam 29 is orientated aslant to the surface 23 of the substrate 21 and, in particular, tangential to the surface 43.

After fully cutting out the lamella 41 from the substrate 21, the tool having the protective structure 9 fastened to it is moved relative to the residual substrate 21 in order to move the lamella 41 away from the residual substrate 21.

Figure 5:
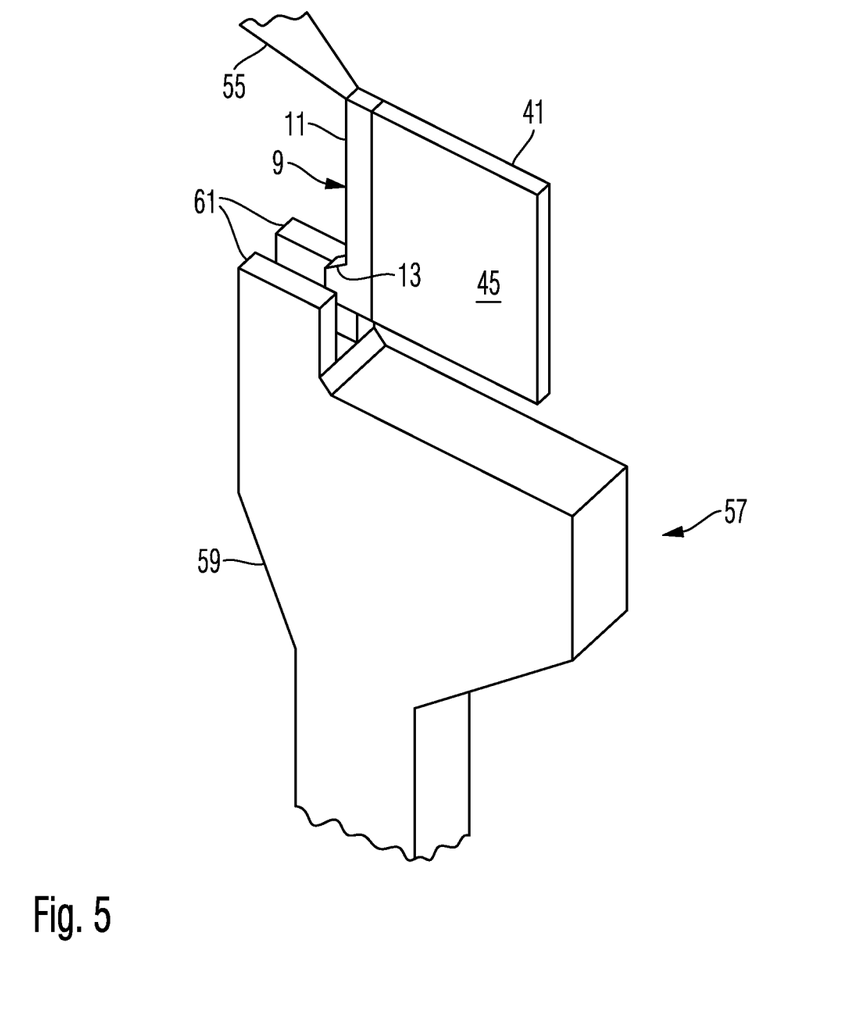

The tool used for this may be the same tool as the tool 5 used for the disposing of the protective structure 9 on the substrate 21. However, it is also possible to use an other tool. This alternative is illustrated in the previous example of FIG. 5 showing a tip 55 of the other tool, the tip 55 of the other tool being brought into contact with the rod-shaped component 11 of the protective structure 9 and being fastened thereto by directing the ion beam onto the tip 55 and the rod-shaped component 11 in order to form molecular bonds between the tip 55 and the rod-shaped component 11 by redeposition of material. However, it also possible to use the other tool for grasping the protective structure 9, detaching the protective structure 9 from the mount 7 and disposing the protective structure 9 on the substrate 21, as indicated in the FIGS. 1 and 2. For this, instead of the tool 5 of FIG. 1, the tip 55 of the other tool may be brought into contact with the handle 13 and the ion beam may be used for forming molecular bonds between the tip 55 and the handle 13.

After moving away the lamella 41 from the residual substrate 21, the lamella is moved to a sample mount 57 and mounted to the sample mount. The sample mount 57 includes a body 59 and two brackets 61 disposed with a distance from each other. The handle 13 of the protective structure 9 may be clamped in between the brackets by moving the tip 55 in a way that the handle 13 is pushed in between the brackets 61. After clamping the protective structure 9 between the brackets 61 of the sample mount 57, the connection between the tip 55 of the tool and the protective structure 9 may be unfastened. This may be done, for example, by moving the tip 55 of the tool relative to the sample mount 57 in a way that the connection between the tip 55 and the protective structure 9 clamped to the sample mount 57 breaks. Furthermore, this can be done by directing the ion beam onto the connection between the tip 55 and the protective structure 9 in order to cut the connection. After unfastening of the tip 55 from the protective structure 9, the lamella 41 is merely mounted to the sample mount 57 and held by the sample mount. Then, it is possible, to direct the ion beam onto the flat side 45 of the lamella 41 so that the lamella is further thinned until the lamella has a thickness appropriate for the analysis using the transmission electron microscope. Then, the sample 57 together with the lamella 41 may be disposed in the transmission electron microscope and the lamella 41 may be analyzed using the transmission electron microscope.

Multiple handles may be provided on the protective structure 9 so as to provide one handle 13 each for fastening the first tool to the lamella and mounting the lamella to the sample mount 57. For example two handles may be disposed at the two ends of the elongated rod-shaped component 11, respectively. In doing so, a tool acting via a gripper or tweezers may grasp the lamella, in particular, the protective structure 9 at a handle disposed at one end of the protective structure 9 and mount the lamella to the sample mount 57 by forming a frictional connection between the brackets 61 of the sample mount 57 and the other handle disposed at the other end of the protective structure 9.

Figure 6:
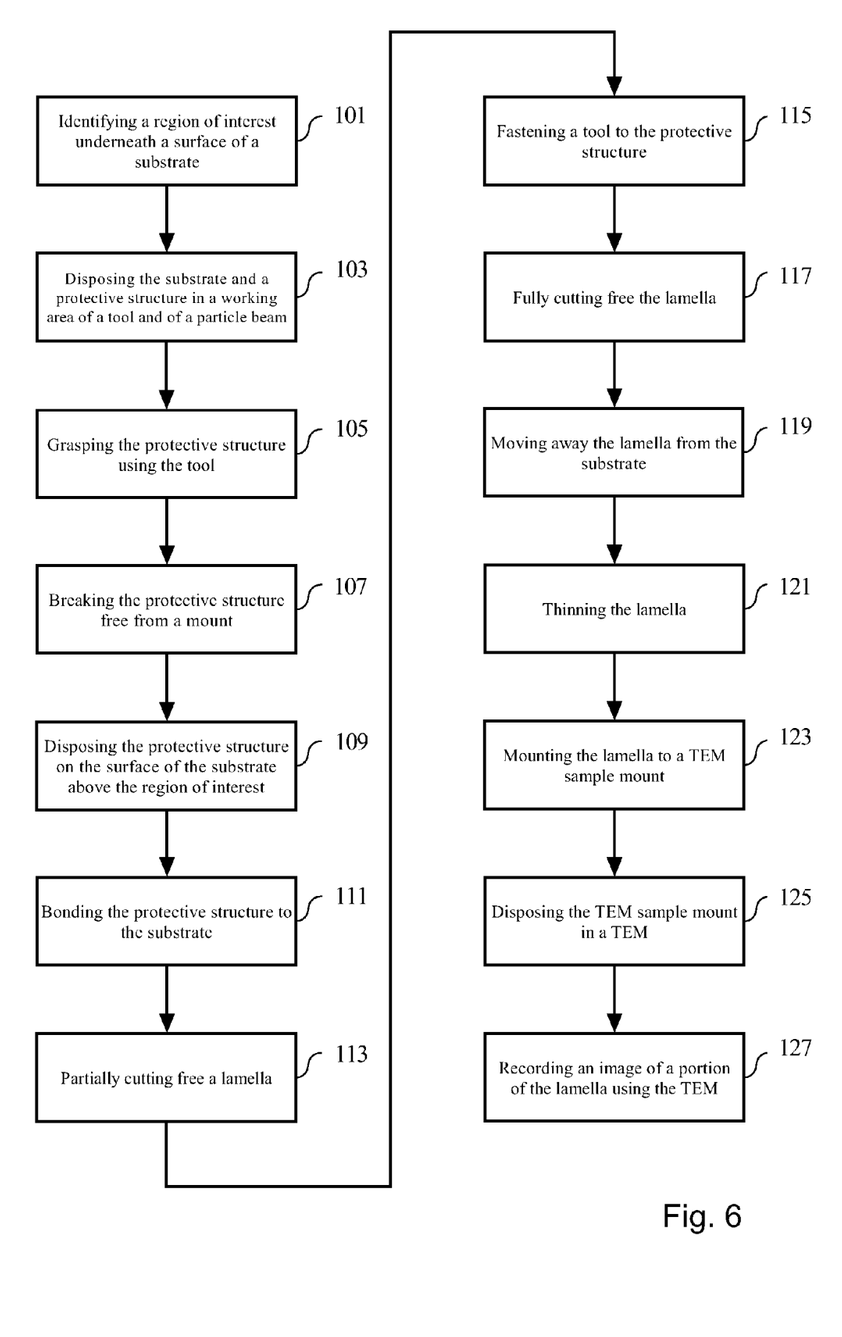
FIG. 6 is a flow chart for elucidating a method for manufacturing a TEM-lamella according to an embodiment of the disclosure.

Embodiments of the method for fabricating a TEM-lamella are elucidated subsequently with reference to the flow chart shown in FIG. 6. First, in a step 101, a region of interest underneath a surface of a substrate is identified. The substrate may be, for example, a semiconductor-wafer and the region of interest may be an element of a circuit assembly fabricated on the semiconductor-wafer.

In a step 103, the substrate is disposed in an ion beam processing apparatus so that the region of interest is disposed within the working area of the ion beam and within or close to the working area of a tool. Furthermore a TEM-lamella protective structure is disposed in the working area of the tool.

In a step 105, the TEM-lamella protective structure is grasped using the tool. For this, any appropriate tool may be used, such as a tool using which the TEM-lamella protective structure may be grasped according to the principles of tweezers, as shown in the FIGS. 1 and 2, or a tool, the tip of which may be fastened to the protective structure by forming molecular bonds, as shown in FIG. 5. After the fastening of the protective structure to the tool, the protective structure is detached from its mount, for example, by breaking in a step 107. Then, in a step 109, the protective structure is disposed on the surface of the substrate by moving the tool over the region of interest. In a step 111, the protective structure is bonded to the substrate. This may be performed by forming molecular bonds, for example, by ion beam processing or by use of an adhesive agent.

In a step 113, the lamella is mostly, i.e., merely partially, cut free from the substrate. Then, in a step 115, a tool is again fastened to the protective structure. For this, the same tool used for the steps 103 through 111 may be used. However, in the step 115, an other tool may be used which is fastened to the protective structure by forming a frictional connection or forming molecular bonds. Then, in a step 117, the lamella is fully cut free and, in a step 119, the lamella is moved away from the substrate.

In a step 121, the lamella is further thinned by ion beam processing so that the lamella is ready for analyzing using a transmission electron microscope. Then, in a step 123, the lamella is mounted to a sample mount by forming a frictional connection or by forming molecular bonds between the lamella or the protective structure and the sample mount. In a step 125, the sample mount together with the lamella held by the sample mount are disposed in the transmission electron microscope and, in a step 127, at least one image of at least a portion of the lamella is recorded using the transmission electron microscope.

It is also possible to mount the protective structure to the sample mount in step 115 and subsequently to perform the steps 117, 119 and 121 as previously described. The step 123 may be omitted in this case as the lamella is already mounted to the sample mount used for the analysis using the transmission electron microscope. Then, the steps 125 and 127 are performed as previously described.

Furthermore, the disposing of the TEM-Sample mount in a separate transmission electron microscope may be omitted if the system in which the particle beam is generated for preparing the TEM-lamella is also appropriate for generating transmission electron microscopic images of the lamella. For this, the device generating the particle beam for preparing and the device generating transmission electron microscopic images are disposed in a common vacuum system. In particular, an electron microscope (SEM) detecting secondary electrons which is used to monitor the progress of the preparation of the TEM-lamella may be configured to also detect transmitted electrons and generate transmission electron microscopic images by use of an additional detector.

Figure 7:
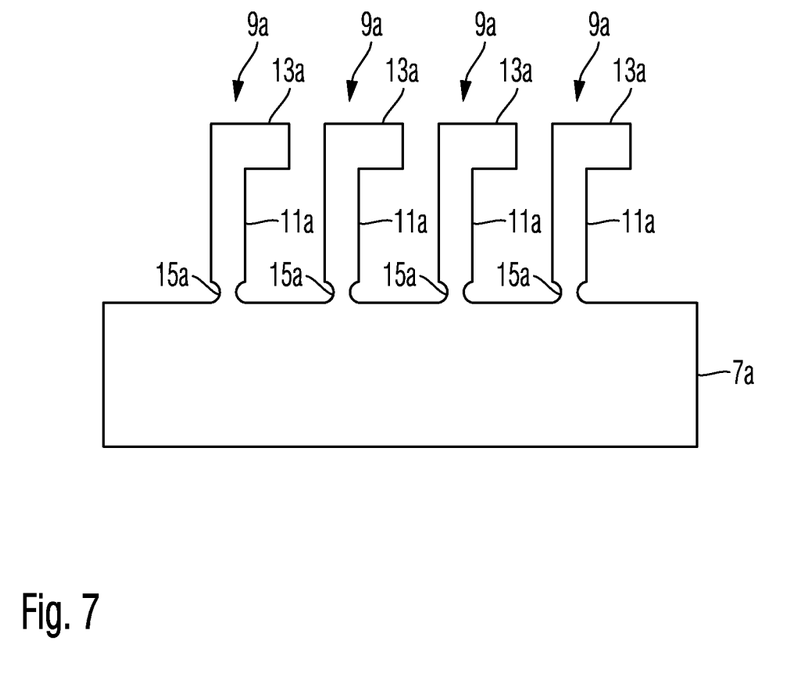
FIG. 7 is a schematic illustration of an assembly having multiple TEM-lamella protective structures.

FIG. 7 illustrates an assembly having a mount 7a and multiple TEM-lamella protective structures 9a attached thereon. The assembly shown in FIG. 7 provides a reservoir for multiple protective structures 9a which may be used in the method previously elucidated. The reservoir of protective structures may be provided in an efficient manner by manufacturing the structure shown in FIG. 7 from an appropriate flat material by laser beam processing, ion beam processing or lithographic steps. Each of the protective structures 9a includes an elongated, rod-shaped component 11a and a handle 13a wherein the rod-shaped component 11a protects the lamella to be manufactured from modification by the ion beam used for cutting out the lamella, and the handle 13a is provided for being grasped using a tool. However, the handle 13a does not need to be provided as a separate element of the protective structure 9a as far as it is possible to fasten the involved tools directly to the rod-shaped component 11a. Furthermore, the handle 13 may also be omitted in the embodiment elucidated with the help of FIGS. 1 and 2 if the rod-shaped component 11 has an extension sufficient to be grasped using the tool 5.

The protective structures 9a are integrally formed with the mount 7a and arranged thereon by predetermined breaking points 15a. By breaking the breaking points 15a, the protective structures 9a may be detached from the mount 7a.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method, comprising:
 disposing a self-supporting protective structure on a surface of a substrate;
 bonding the protective structure to the substrate;
 cutting out a lamella from the substrate using a particle beam so that the lamella remains bonded to at least a portion of the protective structure;
 fastening a first tool to the lamella; and
 moving the first tool relative to the substrate to move the lamella away from a residual portion of the substrate,
 wherein bonding the protective structure to the substrate comprises a process selected from the group consisting of:
  forming molecular bonds between the protective structure and the substrate via a process that comprises: directing a particle beam onto at least one member selected from the group consisting of the protective structure and the substrate; and depositing only material dislodged via the particle beam from at least member selected from the group consisting of the protective structure and the substrate; and
  applying an adhesive agent to at least one member selected from the group consisting of the protective structure and the substrate; and curing the adhesive agent by directing a beam onto a member selected from the group consisting of the adhesive agent, the substrate in proximity of the adhesive agent, and the protective structure in proximity of the adhesive agent, wherein the beam is selected from the group consisting of a particle beam and a light beam.

2. The method according to claim 1, wherein the protective structure has an elongated rod-shaped component having a long side, and the component is disposed at its long side onto the substrate when disposing the self-supporting protective structure on the surface of the substrate.

3. The method according to claim 2, wherein the long side of the rod-shaped component has at least property selected from the group consisting of a length greater than 10 μm and a width less than 5 μm.

4. The method according to claim 1, wherein the protective structure comprises a material selected from a group consisting of silicon, diamond, oxides and nitrides.

5. The method according to claim 1, wherein the protective structure is on a mount, and the method further comprises:
 grasping the protective structure using a second tool;
 detaching the protective structure from the mount; and
 disposing the protective structure on the surface of the substrate using the second tool.

6. The method according to claim 5, wherein the protective structure comprises at least one handle disposed at an elongated rod-shaped component, and the at least one handle is grasped by the second tool when using the second tool to grasp the protective structure.

7. The method according to claim 6, wherein the at least one handle extends from the elongated rod-shaped component.

8. The method according to claim 5, wherein the protective structure and the mount are integrally formed, a predetermined breaking point is between the protective structure and the mount, and detaching the protective structure from the mount comprises breaking the predetermined breaking point by moving the second tool relative to the mount.

9. The method according to claim 5, wherein multiple protective structures are on the mount.

10. The method according to claim 1, wherein fastening the first tool to the lamella comprises bringing the first tool into contact with the portion of the protective structure.

11. The method according to claim 10, wherein fastening the first tool to the lamella comprises forming a frictional connection between the first tool and the portion of the protective structure.

12. The method according to claim 11, wherein the portion of the protective structure comprises at least one handle disposed at an elongated rod-shaped component, and forming the frictional connection between the first tool and the portion of the protective structure comprises forming a frictional connection between the first tool and the at least one handle.

13. The method according to claim 12, wherein the at least one handle extends from the elongated rod-shaped component.

14. The method according to claim 10, wherein fastening the first tool to the lamella comprises forming molecular bonds between the first tool and the portion of the protective structure.

15. The method according to claim 14, wherein forming molecular bonds between the first tool and the portion of the protective structure comprises directing a particle beam onto at least one of the portion of the protective structure and the first tool.

16. The method according to claim 15, wherein forming the molecular bonds between the first tool and the portion of the protective structure comprises depositing only material dislodged via the particle beam from at least one of the protective structure and the first tool.

17. The method according to claim 1, further comprising thinning the lamella using a particle beam so that a thickness of the lamella is less than 200 nm.

18. The method according to claim 1, further comprising mounting the lamella to a sample mount.

19. The method according to claim 18, wherein mounting the lamella to the sample mount comprises bringing the portion of the protective structure into contact with the sample mount.

20. The method according to claim 19, wherein mounting the lamella to the sample mount comprises forming a frictional connection between the sample mount and the portion of the protective structure.

21. The method according to claim 20, wherein the portion of the protective structure comprises at least one handle disposed at an elongated rod-shaped component, and forming the frictional connection between the sample mount and the portion of the protective structure comprises forming a frictional connection between the sample mount and the at least one handle.

22. The method according to claim 21, wherein the at least one handle extends from the elongated rod-shaped component.

23. The method according to claim 20, further comprising disposing the sample mount in a transmission electron microscope, and analyzing the lamella using the transmission electron microscope.

24. A method, comprising:
   bonding a self-supporting protective structure to a substrate;
   cutting out a lamella from the substrate using a particle beam so that the lamella remains bonded to at least a portion of the protective structure; and
   moving a tool relative to the substrate to move the lamella away from a residual portion of the substrate,
   wherein bonding the protective structure to the substrate comprises a process selected from the group consisting of:
      directing a particle beam onto at least one member selected from the group consisting of the protective structure and the substrate; and depositing only material dislodged via the particle beam from at least member selected from the group consisting of the protective structure and the substrate; and
      applying an adhesive agent to at least one member selected from the group consisting of the protective structure and the substrate; and curing the adhesive agent by directing a beam onto a member selected from the group consisting of the adhesive agent, the substrate in proximity of the adhesive agent, and the protective structure in proximity of the adhesive agent, wherein the beam is selected from the group consisting of a particle beam and a light beam.

25. An assembly, comprising:
   a mount; and
   a TEM-lamella protective structure provided on the mount,
   wherein:
      the mount and the TEM-lamella protective structure are integrally formed from a material;
      a predetermined breaking point is between the mount and the TEM-lamella protective structure;
      a cross-section of the material at the predetermined breaking point is smaller than a cross-section of the material at regions of the mount and the TEM-lamella protective structure; and
      the regions are adjoined to the predetermined breaking point.

26. The assembly according to claim 25, wherein multiple TEM-lamella protective structures are provided by the mount.

* * * * *